United States Patent [19]

Ogden

[11] 4,327,126
[45] Apr. 27, 1982

[54] METHOD OF MAKING PRINTED CIRCUIT BOARDS

[76] Inventor: Ralph Ogden, 1304 Fisher St., Munster, Ind. 46321

[21] Appl. No.: 205,108

[22] Filed: Nov. 10, 1980

[51] Int. Cl.³ .............................................. C23C 3/02
[52] U.S. Cl. ...................................... 427/97; 427/98; 427/305; 427/367; 427/370; 204/38 B
[58] Field of Search .................... 427/98, 97, 305, 367, 427/370

[56] References Cited

U.S. PATENT DOCUMENTS

| | | | |
|---|---|---|---|
| Re.29,015 | 10/1976 | DeAngelo et al. | 427/98 |
| 2,721,152 | 10/1955 | Hopt et al. | 117/212 |
| 3,060,062 | 10/1962 | Katz et al. | 117/212 |
| 3,666,549 | 5/1962 | Rhodenizer et al. | 117/212 |
| 3,698,940 | 10/1972 | Mersereau et al. | 427/98 |
| 3,959,523 | 5/1976 | Grunwald et al. | 427/98 |
| 4,216,576 | 8/1980 | Ammon | 29/845 |

*Primary Examiner*—Ralph S. Kendall
*Attorney, Agent, or Firm*—McWilliams, Mann & Zummer

[57] ABSTRACT

A process of making printed circuit boards in which the individual substrates involved are hot set formed from a suitable thermosetting resin and filler composition, with the cure being limited to the resin B stage. The side surfacing of the individual substrates that is to bear the metallic electrically conductive circuiting is catalyzed and then electrolessly plated with copper or the like electrically conductive metallic material to a thickness in the range of from about 50 to about 100 millionths of an inch, and thereafter the thusly plated substrates are hot set to fully cure same and perfect the bond between the substrate and its plating. Each substrate then has a masking and non-conductive resist applied to its plated side (that is to bear the circuit), in a pattern that defines the printed circuit configuration and exposes the underlining electroless plating in the configuration of the circuit for electroplating, after which the substrate is electroplated with copper or the like in the circuit defining voids of the resist thereafter, the resist is stripped from the substrate, and the electroless plating thereby exposed is removed by etching.

10 Claims, 5 Drawing Figures

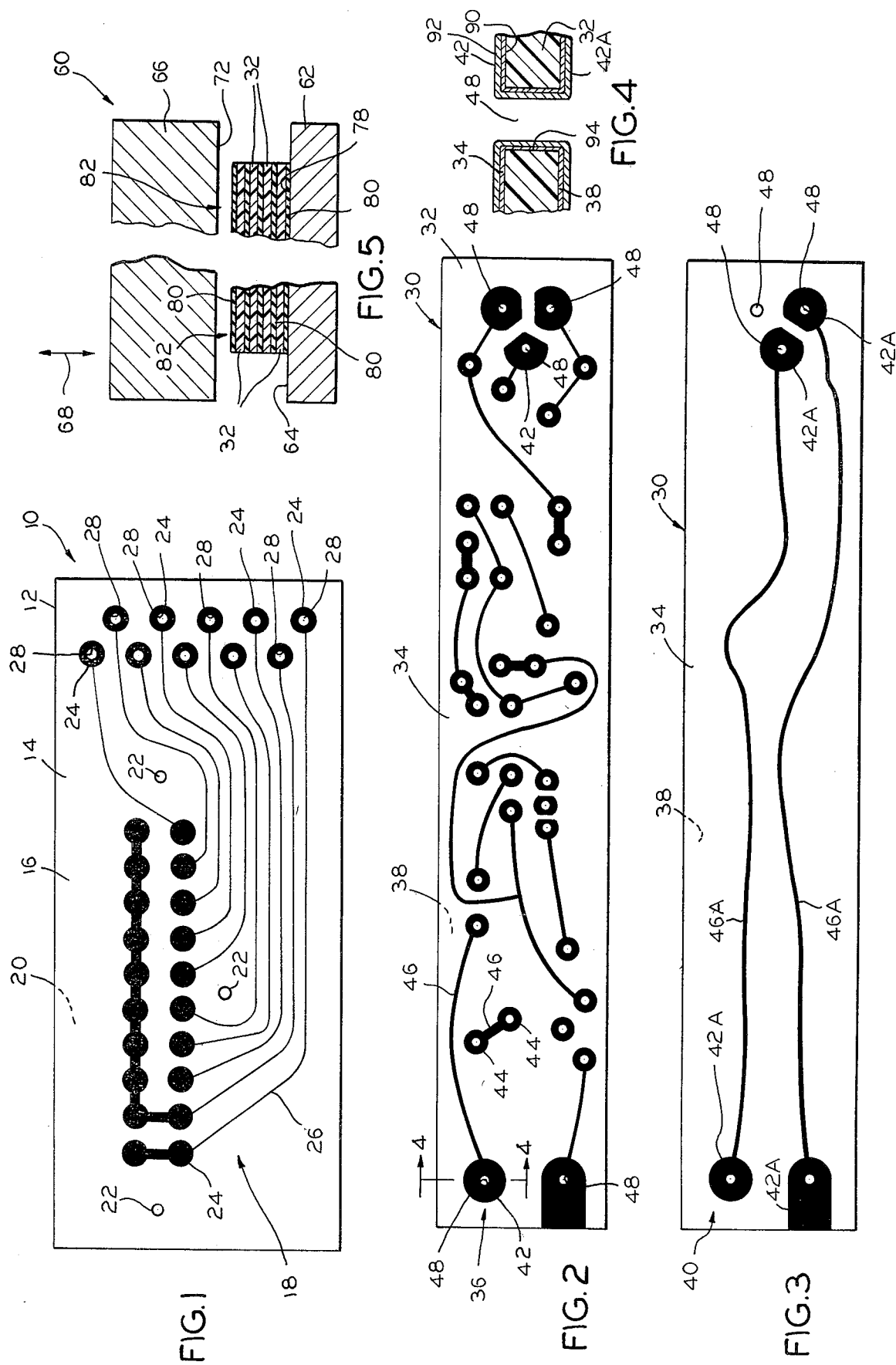

METHOD OF MAKING PRINTED CIRCUIT BOARDS

This invention relates to a method of making printed circuit boards, and more particularly, to a method of forming, curing, and electrolessly plating dielectric non-metallic circuit board substrates, and separately electroplating of the circuitry on the substrates so as to provide for maximized adhesion between the conductive metal forming the finalized circuit, and the dielectric non-metallic substrate, and minimizing plating removal requirements to complete the circuit board.

Rhodenizer et. al. U.S. Pat. No. 3,666,549 brings out that the manufacture of printed circuit boards involving a non-metallic dielectric substrate and a metallic circuit printed thereon basically follow two distinct method approaches, namely the subtractive method and the additive method.

The present invention is directed to employing basically the additive method of making printed circuit boards, with a major objective being to so process the boards that adequate adhesion between the non-metallic dielectric substrate and the conductive metal forming the circuit is assured, thus overcoming the major obstacle to successful additive circuit board processing.

The principal object of the present invention is to provide an essentially additive method of making printed circuit boards, pursuant to which the dielectric thermosetting material substrates that are to become the base piece of the individual boards are initially cured only to their "B stage", with the full cure being effected after the surfaces of the substrates that are to bear the circuitry are thin metal plated.

Another principal object of the invention is to provide an additive method of making printed circuit boards, in accordance with which "B stage" cured substrates, after being thin metal plated, as by employing electroless plating techniques, on the areas of same that are to bear the printed circuiting, are full cured under hot set conditions of temperature and pressure to maximize the bond between the plating and the substrate, as well as effect full cure of the substrate.

Still another important object of the invention is to provide an additive method of making printed circuit boards in which the plating and metal removal requirements are minimized while providing for maximized adhesion between the metallic material forming the circuitry and the dielectric non-metallic theremosetting material forming the substrate.

Other important objects of the invention are to provide an additive method of making printed circuit boards that is readily practiced using existing equipment and techniques for hot setting the board substrates, electroless plating and electroplating of same, and etching of the plating as needed to finalize the shaping of the electrically conductive metallic material forming the circuitry of the board.

In accordance with the invention, the substrates employed to form the base piece or body of the circuit board are formed utilizing suitable hot setting procedures and equipment whereby a suitable thermosetting resin and filler mixture, such as epoxy or phenolic, fiberglas filled compositions, to shape through pressure and heat the base structure involved into the familiar planar, usually quadrilateral configuration, but with the cure of the resulting substrate being limited to the resin "B stage". The substrate surfacing that is to bear the printed circuiting is then suitably catalyzed and then electrolessly plated with a film of copper or the like to a thickness in the range of from about 50 to about 100 millionths of an inch.

The resulting intermediate product is then hot set processed, utilizing appropriate conditions of pressure and heat to fully cure the substrate and perfect the bonding of the film thereto. As part of this procedure, the surfacing of the substrate bearing the film is overlaid with a sheet formed from a suitable elastomer, such as silicone rubber, that is coextensive with the film to insure even distribution of the pressure over the film.

Where the circuit boards are to have through openings in same for circuit connectors and mounting of the board, as the case may be, these openings are formed in the substrate prior to the final cure step, to take advantage of the relatively soft nature of the substrate in its B stage. Where such through openings are in the portion of the electrolessly plated surfacing of the substrate, such through openings are through plated by the electrolessly plating procedure.

The resulting intermediate substrate product may then be stored until needed or immediately processed further in accordance with the invention, whereby a masking resist is applied to the metallic films that are to bear printed circuiting, in a configuration that leaves exposed on the metallic plating the underlying plating in the configuration of the circuit, after which the exposed metallic film portions are electroplated with copper or the like electrically conductive metallic material to build up the thickness of the circuit leads and terminals. Thereafter, the masking resist is stripped from the substrate and the thus exposed electrolessly plated film portions are etched away from the substrates to leave the desired printed circuiting on the substrate that will now have maximized adhesion to the substrate while having only that section thickness that is needed to adequately serve printed circuit functions without leaving excess metallic material on the board, and with freedom from etching under cutting.

Other objects, uses, and advantages will be obvious or become apparent from a consideration of the following detailed description and the application drawing.

In the drawing:

FIG. 1 is a top plan view of a circuit board made in accordance with the invention, having printed circuiting applied to only the top side of same, with the board also being formed with a number of through openings for electrical connectors and several other through openings for mounting of the board in its operating position;

FIG. 2 is a top plan view of a circuit board that is of the double sided type, with the top side of the board having a printed circuiting formed thereof that is arranged for connection with the printed circuiting of FIG. 3 that is on the underside of the board;

FIG. 3 is a plan view of the circuit board of FIG. 2 showing the printed circuit on the underside of same as it would appear if the substrate of the board were transparent and the printed circuiting on the underside of the board of FIG. 2 were viewed from the top side of the board, with the printed circuiting shown in FIG. 2 omitted, for facilitating Illustration, and all but one of the through holes shown in FIG. 2 omitted for simplifying the drawings;

FIG. 4 is a diagrammatic transverse cross-sectional view taken substantially along line 4—4 of FIG. 2, but on an enlarged scale, and diagrammatically illustrating one of the board circuit terminals and through openings for connection purposes, and the plating of and adjacent same that is contemplated by the present invention; and FIG. 5 is a diagrammatic, largely block diagram view, illustrating the manner in which a number of B stage cured, electrolessly plated substrates may be hot set processed for full cure in accordance with the invention to enhance the bonding of the electroless platings to the substrate that is contemplated by the invention.

However, it is to be distinctly understood that the specific drawing illustrations and disclosure provided are supplied primarily to comply with the requirements of the Patent Laws, and that the invention contemplates modifications and variations that will be obvious to those skilled in the art, and which are intended to be covered by the appended claims.

BACKGROUND TECHNOLOGY OF INVENTION

The additive method of making printed circuit boards disclosed herein is concerned with board substrates formed from dielectric non-metallic thermosetting resinous materials that are generally known as resinoids.

As disclosed in "Plastics", by J. Harry DuBois and Fredrick W. John (published 1967 by Van Nostrand Reinhold Company), at page 18, theremosetting compounds may be compared with concrete. Concrete is a mixture of cement and sand which has been hardened by a chemical action in the presence of water. The cement may be said to be a binder for the particle of sand and the sand serves as a filler, decreasing the cost, and providing body and substance to resist dimensional changes.

Chemical changes takes place when the cement "sets", thus producing a solid body of resulting solid substance that retains the form in which it was cast and cured.

In a typical thermosetting material, such as a phenol-formaldehyde compound, the analogy with concrete provides an excellent means for understanding the thermosetting reaction. In this case, the binder or the "cement" is a chemically produced resin, resulting from the partial union of phenol and formaldehyde. A phenol-formaldehyde resin having suitable fillers incorporated in same, such as fiberglas, and the resulting mixture is then pressed to shape in heated dies. The combination of heat and pressure on the compound or mixture in the mold causes it to become plastic and flow to the desired contour as defined by the mold. Continued heat and pressure complete the chemical union of the phenol and formaldehyde with the result that the binder welds the particles of the filler into a single mass that cannot be softened again by heat. The resulting product now resist chemicals which would have dissolved the resin before it passed through the thermosetting reaction in the mold.

Materials of this type are said to be "hot set" or "hot molded" when they are hardened by the addition of heat and pressure, as is the case with thermosetting compounds (see "Plastics" by J. H. DuBois, published 1943 by American Technical Society, at page 21).

By way of contrast, thermoplastic materials may be considered similar to sealing wax, which is a dense hard substance at room temperatures, but when heated becomes soft and pliable and may be molded. When the shaped or molded wax again cools to normal temperatures, it again becomes dense and hard and retains its new shape; unlike thermosetting resins, thermoplastic materials may undergo softening by heating and hardening by cooling again and again. As there is no chemical change in thermoplastic material during heating and cooling cycles of molding, the same chemicals which would attack it before molding will still attack it after molding (see "Plastics" by J. H. DuBois, supra, at pages 4 and 5).

Thermosetting materials or resinoids are considered to be "cured" in being hot set from a soluable or fusable condition to a substantially insoluable-infusable condition by chemical action. This processing is analogous to the vulcanization of rubber (see Plastics Dictionary by Thomas A. Dickinson, published 1948 by Pitman Publishing Corporation, pages 77 and 241).

As the above cited Plastics Dictionary by Dickinson sets forth, at pages 23, 38, and 76, thermosetting resin materials are considered to have three stages of cure, as follows:

The "A stage" is the early period of the reaction during which the thermosetting resin is both soluble and fusible.

The "B stage" is the intermediate period of reaction during which the thermosetting resin materials soften when heated and swell in contact with liquids, but do not completely fuse or dissolve. This is the preferred stage for thermosetting resin materials for molding compositions of same, and it is sometimes called the resitol stage.

The "C stage" is the final period of reaction of the thermosetting resin materials, during which the thermosetting resin becomes infusable and insoluable; this is approximately the state of the resin in the finished article formed by same, and this stage is sometimes called the resite stage.

Circuit board substrates are conventionally formed from suitable thermosetting resin compositions, of which glass-epoxy or phenolic based types are generally preferred for making the substrate, because of their dielectric properties as well as resistance to structural deformation or warpping due to temperature and humidity variations. An example of material in this category is fiberglas filled phenolformaldehyde thermosetting composition, although, as is well known in the art, quite a number of thermosetting compositions of this general category are employed for making substrates, with specific compositions being designed for specific applications as needed.

In FIG. 1, reference numeral 10 generally illustrates a printed circuit board of the one sided or single sided type comprising substrate 12 that is formed from one of the usual thermosetting resin compositions that is hot set to define a planar body 14 of quadrilateral configuration (rectangular in the illustrated embodiment) of suitable thickness in defining an upper side surfacing 16 to which printed circuiting 18 is applied, an underside 20 that is free of printed circuiting, and three through openings 22 that in the form shown are drilled or punched in the substrate 14 for purposes of mounting the board 10 in its position of operation. The printed circuit 18 itself comprises plurality of pads or terminals 24 and traces or leads 26 that are formed from a suitable electrically conductive metallic material such as copper or nickel, and that are adhered to the top surfacing 16 of the substrate 12. In the specific printed circuiting 18 illustrated, a number of the pads or terminals 24 do not have through openings for connectors, while others do, such as the through openings 28 about which the pads or terminals 24 at the right hand end of the board 10 are formed.

The board 10 is electrically arranged in the manner shown in FIG. 10 of my U.S. Pat. No. 4,214,153, granted July 22, 1980, in which the circuit board there illustrated is arranged for use in a tape reader for programmable controllers.

FIGS. 2 and 3 illustrate the general arrangement of a typical two sided or double sided printed circuit board, in which the printed circuiting is applied to both sides of the board. The board 30 comprises suitable substrate 32 shaped to have the elongated quadrilateral configuration illustrated and having a top side surfacing 34 that bears printed circuiting 36 and an underside surfacing 38 which bears printed circuiting 40. As has already been indicated, the board 30 in FIG. 2 is viewed from its top surfacing 34 while in the showing of FIG. 3 the printed circuiting 36 is omitted and the printed circuiting 40 is illustrated as viewed from the top surfacing side 34 of the board 30, and thus through the board 30, so as the relation of the two circuitings 36 and 40 will be more readily apparent. The circuiting 36 defines larger pads or terminals 42, smaller pads or terminals 44, and leads or traces 46, with the circuiting 36 illustrated having its pads or terminals 42 disposed about through openings 48 of the board 40. The board substrate is solid or imperforate underlying the smaller pads or terminals 44.

The circuiting 40 of the side surfacing 38 comprises only the larger pads or terminals 42A and traces or leads 46A. The terminals 42A of the specific circuit board 30 illustrated are applied about two of the through apertures 48 at either end of the board, with the third through opening 48 at the right hand end of the board not having a terminal 42A applied thereabout, and with the remainder of such openings 48 of the board side surfacing 38 (that are not associated with a terminal 42A) are omitted, but they would have the positioning indicated in FIG. 2 (laying the showing of FIG. 2 on top of the showing of FIG. 3).

The showings of FIGS. 1-3 are provided primarily to specifically illustrate the general nature of circuit boards that are made in accordance with the practice of this invention. The invention of this application is not concerned with the specific configuration of the circuitings 18, 36 and 40 that are illustrated, but rather the manner of application of the terminals and leads there illustrated, or any other printed circuit arrangement of leads and traces that may be desired in connection with or for printed circuit boards. However, the methods hereinafter described take account of the fact that single or one sided circuit boards of the type indicated in FIG. 1 may be handled somewhat differently than double sided circuit boards that are represented by the showings of FIGS. 2 and 3.

APPLICANT'S CIRCUIT BOARD MAKING METHODS

In accordance with the invention, circuit board substrates, as represented by the substrates 12 and 32, are made using a suitable thermosetting composition therefor and hot set procedures and equipment in connection therewith, with the specific substrates being produced being shaped as desired for specific applications. As is conventional, the substrate forming materials, such as the phenol-formaldehyde resin and fiberglas filler hereinbefore referred to, or any other thermosetting composition, is applied to, for instance, a suitably arranged compression molding process molding machine or other appropriate hot set equipment, several forms of which are diagrammatically illustrated in the references cited above. The hot setting of the materials involved to form the individual substrates proceed in accordance with standard practices, except, in accordance with the present invention, the hot setting processing is terminated, and the substrates are removed from the mold, when in their resitol or B stage of cure, with these terms having the meaning defined by the cited Thomas A. Dickinson Plastics Dictionary (at page 38).

The resitol stage or B stage cured substrates form the base structure of the printed circuit board, in accordance with this invention. Of course, for mass production purposes, quite a number of the substrates in question may be made up and suitably stored until needed for further processing in accordance with the practice of the invention. It is important, however, that the B stage cure status of the substrates be maintained, and it may thus be appropriate under some circumstances to store the thus formed substrates in cool storage areas or perhaps even under refrigerated ambient conditions.

Thereafter, one way of processing the individual substrates in accordance with the invention is as follows:

The substrate to be made into a finished circuit board in accordance with the practice of the invention, assuming its B stage cure status still obtains, is first catalyzed, for instance, in the manner suggested by said Rhodenizer et. al. patent at column 5; suggested is a two step activation procedure using stannous chloride in hydrochloric acid followed by a dip in palladium chloride in hydrochloric acid. Alternately, as suggested by the reference indicated, the catalyzation may be effected by a one step procedure employing a tin-palladium hydrosol such as that disclosed in U.S. Pat. No. 3,532,518. It may be also be desired to subject the catalized substrate to an accelerating solution, as, for example, a dilute solution of suitable acid or alkali, as suggested by Rhodenizer.

Thereafter, the side surface of the substrate that is to bear the printed circuiting has applied thereto a thin film of a suitable electrically conductive material, such as copper, by way of conventional electroless metal plating procedures. The metal deposit contemplated is to be over the entire side surfacing of the substrate side involved, but it is a feature of the invention that this film be minimal to conserve the valuable metal involved and minimize the amount of the metal that needs to be removed by etching at the final stages of the Applicant's method for avoiding undercutting of the pads and traces.

Specifically, it is preferred that the electrolessly plated film have a thickness in the range of from approximately 50 millionths of an inch to approximately 100 millionths of an inch. Typical compositions of electroless copper baths suitable for practice of the invention are disclosed in U.S. Pat. Nos. 2,874,072, 3,075,855, and 3,095,309. The purpose of the electrolessly plated film is to provide an initial conductive surface on the side surfacing of the substrate that is to bear the printed circuiting in order to facilitate electro disposition of metal plating in the appropriate place in accordance with the later described electro plating steps of the invention. The thickness of the electroless metal coating should be as thin as practical; preferably it is no more than a 100 millionth of an inch and exceeds a 50 millionth of an inch only to the extent needed for effectively performing the electroplating step or steps that are to follow.

Where the substrate involved is to have both side surfaces of the substrate bear printed circuiting, as illustrated by the board 30, the substrate involved is dipped into an appropriate electroless copper bath so that the substrate involved is totally electrolessly plated within the thickness range indicated. The electroless plating will thus also be through the through holes 48 (if such holes have been drilled) and along the side edges and end edges of the substrate; in other words, the entire surfacing of the substrate at this stage will have an electroless copper coating.

Where the board is of the single sided type, in connection with which the printed circuiting is applied only to one side of the board, it is only necessary to plate the one side of the board involved. One way of effecting this is to cement together two of the boards by applying a narrow band of adhesive along their margins and clamping or holding them together until the adhesive hardens. The pairs of bonded together substrates are then electrolessly coated in the same manner as substrates that are to be made into double sided boards, after which the bonded together boards are separated for further processing in accordance with the invention.

Thereafter, the electroless plated substrate is subject to suitable hot press procedures to complete its cure through the resite or C stage. In this processing of the board, it is a feature of the invention that the board, electrolessly plated as indicated, be subjected to both pressure and temperature conditions that affect the full C stage cure, with the board under the indicated pressure conditions having the pressure evenly applied across the surfacing of the electroless plating involved.

One way of doing this is diagrammatically illustrated in FIG. 5 for the substrates that are to be double sided boards. In the showing of FIG. 5, a compression molding apparatus 60 is illustrated comprising a fixed base member 62 having a planar compression face 64, and a movable plunger member 66 that is suitably hydraulically actuated to move vertically in either direction, as indicated by the arrow 68, and having a planar compression face 72 to be applied against substrates disposed on compression face 64 for this purpose.

The mold apparatus 60 includes suitable movement guide means, and heating, actuating, and other conventionally needed or desired equipment of a conventional nature that is not illustrated since anything of this type of a conventional nature will serve the purpose. Members 62 and 66 may be formed from steel or the like.

In using the mold apparatus 60, double sided substrates of the same size and shape, for instance, substrates 32, are applied to the compression surface 64, which for production purposes should be in substantial parallelism with corresponding surface 72. In loading the apparatus 60, plunger member 66 is suitably spaced from base member 62, and a thin sheet of a suitable elastomeric material, such as silicone rubber, is applied on the surface 64 of the die in centered relation thereto, where indicated at 80, and one of the substrates 32 that has been electrolessly copper film plated as described above is laid thereon and covered by a succeeding sheet 80 of the same elastomeric sheeting. The substrates 32 that have been electrolessly copper film plated as described above and the elastomeric sheets 80 are stacked in alternating relation, as indicated in the showing of FIG. 5 so that each electrolessly plated side surfacing of the substrate 40 will have bearing thereagainst one of the elastomeric sheets 80. The stack 82 to be processed by the operation of the apparatus 60 is completed by a final elastomeric sheet 80, and then the apparatus 60 is run through its compression stroke, to place the stack 82 under suitable conditions of pressure, coordinated with appropriate conditions of temperature by heating the apparatus 60 in any conventional manner so that the cure of the substrates 32 being processed advances through the indicated C stage. During this period, the electroless film plating is also compressed against the substrate 32 on which it is plated, and at the side surfacing of same that is to bear the printed circuiting, thereby effecting, in accordance with the practice of the invention, significantly improved adhesion between the individual substrates and the conductive metal films electrolessly applied thereto. While the reasons for achieving the improved adhesion that results are not fully understood, it is believed that the result comes by way of a combination of factors involved in this step of the procedure whereby not only are the substrate and the film that has been electrolessly applied thereto pressed thereagainst subject to both heat and pressure, but the substrate is advanced from its B stage cure through its C stage cure, whereby apparently the chemical changes taking place as the cure advances through C stage effect an appreciable degree of "cementing" of the electroless metal film to the substrate, in addition to the substrate mass itself being irreversibly hardened through full cure.

When full cure has been achieved, as is determined by conventional instrumentation for indicating pressures, temperatures, timing, and the like, the apparatus 60 is opened for removal of the stack 82 and application thereto of a fresh stack 82 to be similarly processed.

Where the substrates being processed are to be single sided, in forming a stack 82 for same the lowermost elastomeric sheet 80 may be omitted assuming that the first substrate, for instance, a substrate 12, is applied to the mold surface 64 with its unplated side engaging surface 64. The upwardly facing and plated side surfacing of the substrate 12 has applied thereto a elastomeric sheet 80, which is followed by the next substrate 12 having its electrolessly plated side engaging the first elastomeric sheet 80. The next substrate 12 is applied to the stack with its unplated side engaging the unplated side of the substrate immediately preceeding it, and has an elastomeric sheet 80 applied to its plated side on which in turn the next substrate 12 is plated with its plated side engaging the sheet 80. The stack is completed by alternating the substrates 12 in pairs and the elastomeric sheets 80 between the passed substrates, with the final substrate, in having its unplated side facing upwardly, not requiring a sheet 80 overlying same. Full cure is then achieved as already described as described.

The substrates 32 or 12 being processed are preferably of the same shape in perimeter, and the elastomeric sheets 80 are preferably of similar shaping, although sheets 80 may desirably exceed the size of the substrates 32 and 12 in marginal dimensioning for ease of application. Sheets 80 may be formed from silicone rubber sheeting having a thickness in the range of from about 0.003 inch to about 1/16th inch; other suitable elastomeric material will serve the purpose, the main thing being that sheets 80 adequately pass heat and pressure therethrough. The sheets 80 insure uniform application of pressure to the plated surfaces of substrates 12 and 32, as the substrates 12 and 32 themselves generally will not be perfectly flat, by serving as mediums for applying heat and pressure thereto that also readily conform under pressure to the substrate surfacing shapings for full and uniform engagement or contact therewith.

The fully cured substrates 12 and 32 may now be either directly processed in accordance with the invention to provide completed printed circuitboards, or stored until needed, or shipped to processers who manufacture printed circuit boards. In any event, the substrates that have been electrolessly copper film plated and fully cured as described above are processed to the final printed circuit board position as follows:

The board is first cleaned as needed by a suitable rinsing step or the like, to insure that the electrolessly applied copper film is clean, and then the substrate has applied to its film covered side surfacing a suitable resist coating, the function of which is to expose only those portions of the film that are to define the contour of the printed circuiting to be provided by the finished board, and to cover the remaining portions of the film to preclude electroplating of same in the electroplating step that is to follow.

In the practice of the invention, it is preferred that a suitable chemical resist be applied to the substrate film utilizing appropriate silk screen equipment and techniques that are designed to produce coverage of the non-circuit areas of the substrate film in question with the resist while leaving the circuit forming areas of same free of the resist. Thus, the silk screening is arranged to apply the resist to the substrate film in a negative pattern that leaves voids in the resist which define contouring or outlining identical to the contouring of the printed circuiting that is to be ultimately provided by the board being processed. Equipment of this type involves the resist being squeegeed through the screen by appropriate squeegeeing techniques.

Suitable chemical resists that may be employed for the purpose are the Dynacure products SR-28 or SR-30ST, offered by Dynachem Corp. of Minneapolis, Minnesota, but any conventional chemical resist that is dielectric or electrically insulating in nature will be satisfactory.

The substrate having its electroless metallic film resist covered as indicated, is then electroplated to plate in the voids defined by the resist the electrically conductive material that is to have the contour of the printed circuiting involved and that is to be built up to the thickness appropriate for printed circuiting electrically conducting requirements. However, it is a feature of this invention that the electroplating thickness provided, combined with the thickness of the electroless plating, be no more than is appropriate for good electric conducting purposes to avoid the common problem of undercutting at the etching stage of the Applicant's method.

The substrate to be electroplated is applied to conventional electroplating equipment, which is facilitated because of the application of the electroless metal film on the side surfacing of the substrate that is to receive the printed circuiting. Thus, in using such equipment, a single connection may be made to the substrate, and specifically its electroless coated metallic film at any point on the conductive surface of the substrate, whereby the electroless coated film is made the cathode of the conventional electroplating equipment in its bath, with the result that the material to be electroplated on the substrate in the voids defined by the resist will be applied thereto in accordance with conventional electroplating techniques. Preferably this material is copper or nickel.

The application of the resist to the substrates and the electroplating of same will be essentially the same for double and single sided substrates, except, of course, for the double sided substrates, which are to be double sided printed circuit boards, the application of the resist and the electroplating is effected to both sides of the substrate.

Where the printed circuit configuration as defined in negative pattern by the resist includes one or more through holes or openings 48, the electroplating is applied through such holes, this being illustrated by the showing of FIG. 4 wherein the terminals 42 and 42A at a substrate opening 48 are illustrated in section, with the electroless film being illustrated at 90 and the electroplating layer being indicated at 92. It is to be noted that the film 90 and the layer 92 cover the substrate surfacing 94 that defines the through opening 48 as well as the substrate top surfacing 34 and the substrate undersurfacing 38 (to the extent that the terminals 42 and 42A are laid out or formed about the through openings 48) are illustrated in section, with the electroless film being illustrated at 90 and the electroplating layer being indicated at 92. It is to be noted that the film 90 and the layer 92 cover the substrate surface in 94 that defines the through opening 48 as well as the substrate top surfacing 34 and the substrate undersurfacing 38 (to the extent that the terminals 42 and 42A are laid out or formed about the individual through openings 48).

Where the through openings 48 do not lie within the contouring of the printed circuiting that is to be provided, they will be covered by the resist and thus will not be through plated. Examples are the through openings 22 shown in the single sided board 10 of FIG. 1, which are board mounted openings and are not provided for electrical connectors. The through openings 28 of the board 10 are through plated, but, of course, the terminals 24 thereof are formed only on one side of the board. At the undersurfacing 38 of board 30, where the through holes 48 do not lie within a terminal 42, the electroless film 90 will cover or coat the portion of the hole 48 adjacent side surface 34, and the resist will coat the portion of such hole 48 adjacent surfacing 38, so that such holes 48 are not through plated.

In accordance with the practice of the invention it is preferred that the electroplating step apply the electroplated metal to the electrolessly deposited metal in an amount that lies in the range of from approximately one-half thousandths to approximately 3 thousandths inch, depending on the application to which the board is to be put.

After the electroplating is completed, the deposited electroplate can be further electroplated with protective metal such as gold or silver, or with solder and serve both as a resist in subsequent etching procedures, as well as a protective coating and also serving to facilitate subsequent attachment of accessory electronic components to the completed board. This may be done utilizing suitable metal plating techniques.

After the electroplating has been completed, the resulting board is then stripped of the chemical resist by dipping the board in a suitable solvent as needed to fully strip the chemical resist from the electrolessly plated film. A suitable resist remover is a twenty-five percent aqueous solution of sodium hydroxide (Na OH) at a temperature of approximately 110 degrees F.

Thereafter the board is emersed in a suitable etchant, such as dilute nitric acid, to strip the noncircuit areas of the board of all conductive metal.

In the practice of the invention, it is ordinarily not necessary to protectively plate the built up portions of the printed circuitry, which have been built up in the present instance by electroplating of copper thereon. While during the etching procedures, some copper will be removed from the electroplated metal exterior, while the electrolessly applied copper film is being removed exteriorily of the electroplated metal, the combined electrolytically applied metal and the electrolessly applied metal film remaining underlying same together will have a section or thickness appropriate for printed circuit electro conductivity. The thinness of the electrolessly applied film that is removed is such that during the etching step, the etching time requirements are so short that there is no time for the etchant to make any significant undercutting of the pads and traces. This minimal etching time is a significant and critical aspect of the invention for that purpose, and should be closely controlled to effect removal of all the exposed electrolessly plated metal which avoids undercutting of the board pads and traces.

With the etching step completed, the boards are suitably rinsed and dried. The processing of the circuit boards in accordance with the indicated version of the invention then is complete, and they are ready for packaging and shipping for distribution purposes, or direct application to electronic apparatus, depending on the circumstances.

In practicing the invention, the electroless film may be in the form of nickel, as suggested by said Rhodenizer et. al. patent with reference to U.S. Pat. Nos. 2,532,283, 2,990,296, and 3,062,666, as illustrating nickel electroless baths.

As to the resist employed, instead of using a suitable chemical resist, a suitable photoresist composition may be employed, with the photoresist being processed in accordance with existing technology relating to same, which will depend on whether the photoresist is of the positive or negative type. Suggestions with regard to photoresist use are contained in the cited Rhodenizer et. al. patent.

The electroplating of the electrolessly applied film may be effected using nickel instead of copper, or other suitable electrically conductive metals as desired, with the electroplating equipment being varied according, following conventional procedures.

It will therefore be seen that the invention provides a method of making printed circuit boards that is adapted for practice with essentially conventional apparatus, while simplifying the procedures involved and utilizing only that amount of the electrically conductive metals needed to result in printed circuiting depth or section of adequate conductivity without unnecessary depth. The minimizing of the depth of thickness of the electroplated metal is an important factor in avoiding undercutting of the electrically conductive material outlining the circuiting since undercutting when etching tends to occur in a dimension that corresponds to the thickness of the plated metal removed by etching. As undercutting necessarily weakens the adherence of the plated metallic materials to the non-metallic substrate, it is important that excessive undercutting be avoided.

In practice of the invention, the electroplating build up of copper or the like on the electrolessly plated metal should only be enough to meet the electrically conductive needs of the circuit board circiting. As indicated, a simplified approach preferred for this invention involves not masking the electroplated metal to protect same with etching, so the amount of the electroplated deposit under such circumstances must take into consideration that portion of the electroplated deposit that will be removed by the etching procedures.

It is believed that the application of the electrolessly plated film to B stage cured substrates and the cure completion effected by the practice of the invention are important factors in the improved adherence of the printed circuit forming metal to the substrate, that is obtained by the practice of the invention.

Variations in the herein described method are contemplated depending on the needs and facilities of the processors who do the actual circuit forming steps.

For instance, the processor may start with blank substrates, unplated, free of apertures, and B stage cured. After sizing of the board, the processor may drill or punch the board through holes, with increased tool life and speed due to the softer nature of the B stage material. Deburring needs are also eliminated, as drilling of previously plated substrates forms metallic burrs that must be deburred. After formation of the substrate through holes, the processor proceeds with the electroless plating, C stage cure, and the electroplating and related steps herein disclosed.

Alternatively, the substrates may be made up for the processor in blank (through hole free), B stage cured, and electrolessly coated on one or both sides. The processor would then drill the needed through holes and provide the C stage cure, and resist coat, and electroplate, etc., as hereindisclosed to complete the board.

The substrates may also be made up for the processor in blank (through hole free), B stage cured, electrolessly plated on both sides for a full electroless film coating, C stage cured, the holes drilled, then fully electrolessly coated again to so coat the through openings, then resist coated, electroplated, etc., as herein disclosed to complete the board.

The foregoing description and the drawings are given merely to explain and illustrate the invention and the invention is not to be limited thereto, except insofar as the appended claims are so limited, since those skilled in the art who have the disclosure before them will be able to make modifications and variations therein without departing from the scope of the invention.

I claim:

1. In the method of making printed circuit boards that are to include a dielectric substrate having printed circuitry applied thereto in a pattern defined by a film of electrically conductive metal electrolessly plated on the substrate that is electroplated over in conformity to such pattern, with the remainder of the film being etch removed from the substrate, the manner of making the substrate which comprises the steps of:

hot setting a thermosetting resin and filler mixture to form and cure the substrate in planar configuration defining opposed side faces forming the substrate side surfacings, with the cure being limited to the resin B stage cure, catalyzing at least one side surfacing of the substrate, then electrolessly plating said substrate one side surfacing with the film of electrically conductive metal, then taking a plurality of said substrates, stacking them with elastomeric sheets in intercalated relation therebetween, with one of said elastomeric sheets engaged with each said one side surfacing, in coextensive relation therewith, for each substrate in the stack, and subjecting said stack to compressive pressure, acting normally of said substrates and said sheets, and heat, to hot pressure set said substrates to cure same through their C stage cure, while, in the case of each substrate, compressing said film thereof against said one side surfacing thereof with uniform pressure over said one side surfacing thereof through the elastomeric sheet engaging same.

2. The method set forth in claim 1, wherein in the electroless plating step the film has a thickness in the range of from about fifty to about one hundred millionths of an inch, and wherein in the etch removal of the film remainder the etching time is confined to that which leaves the pattern free of significant undercutting.

3. The method set forth in claim 1, wherein in the stacking and hot pressure set steps, said elastomeric sheets are of silicone rubber sheeting having a uniform thickness that lies in the range of from about 0.003 inch to about 1/16th inch.

4. The method set forth in claim 1 wherein:
prior to said electroless plating step, one or more circuit connector through holes are tool formed in the substrate.

5. The method set forth in claim 1 wherein:
the other side surfacing of the substrate is maintained free of the electroless plating and the electroplating.

6. The method set forth in claim 1 wherein:
both side surfacings in the electroless plating step are electrolessly plated.

7. In the method of making printed circuit boards that are to include a dielectric substrate having printed circuitry applied thereto in a pattern defined by a film of electrically conductive metal electrolessly plated on the substrate that is electroplated over in conformity to such pattern, with the remainder of the film being etch removed from the substrate, the manner of making the substrate which comprises the steps of:

hot setting a thermosetting resin and filler mixture to form and cure the substrate in planar configuration defining opposed side faces for bearing the board circuitry, with the cure being limited to the resin B stage cure, .

catalyzing the substrate external surfacing, then electrolessly plating the substrate external surfacing including said side faces thereof with the film of electrically conductive metal, then taking a plurality of said substrates, stacking them with elastomeric sheets in intercalated relation therebetween and at the ends of the stack, with said sheets alternating with said substrates and being coextensive therewith throughout the stack and at its ends, and subjecting said stack to compressive force, acting normally of said substrates and said sheets, and heat, to hot pressure set said substrates to cure same through their C stage cure, while, in the case of each substrate, compressing the film on either side face of same against the respective side faces thereof with uniform pressure through the respective elastomeric sheets engaging same.

8. The method set forth in claim 7 wherein in the electroless plating step the film has a thickness in the range of from about fifty to about one hundred millionths of an inch, and wherein in the etch removal of the film remainder the etching time is confined to that which leaves the pattern free of significant undercutting.

9. The method set forth in claim 7 wherein in the stacking and hot pressure set steps, said elastomeric sheets are of silicone rubber sheeting having a uniform thickness that lies in the range of from about 0.003 inch to about 1/16th inch.

10. The method set forth in claim 7 wherein
prior to said electroless plating step, one or more circuit connector through holes are tool formed in the substrate.

* * * * *